United States Patent [19]
Frei et al.

[11] Patent Number: 6,136,673
[45] Date of Patent: *Oct. 24, 2000

[54] PROCESS UTILIZING SELECTIVE TED EFFECT WHEN FORMING DEVICES WITH SHALLOW JUNCTIONS

[75] Inventors: Michel Ranjit Frei; Thi-Hong-Ha Vuong, both of Berkeley Heights; Ya-Hong Xie, Flemington, all of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 09/023,220

[22] Filed: Feb. 12, 1998

[51] Int. Cl.$^7$ .................................................. H01L 21/22
[52] U.S. Cl. ........................................... 438/545; 438/528
[58] Field of Search .................................. 438/510, 514, 438/519, 520, 530, 542, 471, 515, 528, 545; 257/655

[56] References Cited

U.S. PATENT DOCUMENTS

| | | | |
|---|---|---|---|
| 3,718,502 | 2/1973 | Gibbons | 117/212 |
| 4,133,701 | 1/1979 | Greenstein et al. | 21/263 |
| 4,456,489 | 6/1984 | Wu | 21/265 |
| 5,145,794 | 9/1992 | Kase et al. | 438/515 |
| 5,286,660 | 2/1994 | Chiou et al. | 21/265 |
| 5,585,286 | 12/1996 | Aronowitz et al. | 437/24 |
| 5,825,066 | 10/1998 | Buynoski | 257/345 |
| 5,899,732 | 5/1999 | Gardner et al. | 438/473 |
| 6,037,640 | 3/2000 | Lee | . |
| 6,043,139 | 3/2000 | Eaglesham et al. | . |
| 6,063,682 | 5/2000 | Sultan et al. | . |

FOREIGN PATENT DOCUMENTS

| | | | |
|---|---|---|---|
| 0 806 794 A2 | 11/1997 | European Pat. Off. | 21/265 |
| WO98/47171 | of 0000 | WIPO | 21/265 |

OTHER PUBLICATIONS

Ebbing D., General Chemistry, 3rd Edition, Figure 10.31, p. 388, 1990.

"Three–Dimensional Characterization of Bipolar Transistors in a Submicron BIMOS Technology Using Integrated Process and Device Simulation", by Pinto, M. R. et al., *IEEE*, 0–7803–0817–4/92, pp. 923–926 (1992).

"Very–High–Speed Silicon Bipolar Transistors with In–Situ Doped Polysilicon Emitter and Rapid Vapor–Phase Doping Base", by Uchino, T. et al., *IEEE Transactions on Electron Devices*, vol. 42, No. 3 pp. 406–412 (Mar. 1995).

"Implanting Damage and the Anomalous Transient Diffusion of Ion–Implanted Boron", by Michel, A. E. et al., *Appl. Phys. Lett.*, vol. 51, No. 7, pp. 487–489 (Aug. 1997).

"Transient Phosphorus Diffusion Below the Amorphization Threshold", by Giles, M. D. et al., *J. Electrochem. Soc.*, vol. 138, No. 4, pp. 1160–1165 (Apr. 1991).

"Ion Implantation and Transient Enhanced Diffusion", by Poate, J. M. et al., *IEEE*, 7803–2700–4, pp. 77–80 (1995).

C. M. Osburn et al., "Ultra–Shallow Junction Formation Using Very Low Energy B and BF2 Sources", Proceedings of the 11th International Conference on Ion Implantation Technology, Jun. 1996, pp. 607–610.

R. Angelucci et al., "Temperature and Time Dependence of Dopant Enhanced Diffusion in Self–Ion Implanted Silicon", J. Electrochem. Soc., 1987, vol. 134, p. 3130–3134.

R. B. Fair, "Shallow Junctions—Modeling the Dominance of Point Defect Charge States During Transient Diffusion", Technical Digest., International Electron Devices Meeting, 1989, pp. 691–694.

*Primary Examiner*—Charles Bowers
*Assistant Examiner*—Evan Pert
*Attorney, Agent, or Firm*—Richard J. Botos

[57] ABSTRACT

A process for device fabrication in which transient enhanced diffusion (TED) is used to obtain a desired distribution of dopants in a crystalline substrate is disclosed. In the process, at least two dopants and a non-dopant are introduced into the same region of a substrate. The diffusion of the dopants in the substrate during a subsequent thermal anneal is affected by the non-dopant. The amount of non-dopant introduced into the substrate is selected to obtain, in conjunction with the subsequent thermal anneal, the desired distribution of dopants in the substrate. The concentration of the non-dopant is in the range of about $6\times10^{16}$ atoms/cm$^3$ to about $3\times10^{21}$ atoms/cm$^3$. The substrate is then annealed at a temperature in the range of about 700° C. to about 950° C. to obtain the desired dopant profile.

10 Claims, 3 Drawing Sheets

PROCESS UTILIZING SELECTIVE TED EFFECT WHEN FORMING DEVICES WITH SHALLOW JUNCTIONS

BACKGROUND OF THE INVENTION

1. Technical Field

This invention is directed to processes for device fabrication in which the devices are semiconductor devices with shallow junctions.

2. Art Background

Semiconductor devices such as complementary metal-oxide-semiconductor (CMOS) devices and bipolar junction transistor devices (BJTs) such as field effect transistors (FETs) have junctions formed in the substrate by introducing impurities (dopants) into the substrate. The dopants used to form regions of the junction (e.g. the source and drain in a CMOS device and the emitter in bipolar device) are of a different type (n-type or p-type) than the semiconductor substrate body surrounding these regions. These regions are of opposite doping type so that substantially no current will pass from the source to the semiconductor body or the drain to the semiconductor body.

The usual method of introducing dopant atoms which is controllable, reproducible, and free from most undesirable side effects is ion implantation. During ion implantation, dopant atoms are ionized, accelerated, and directed at a crystalline substrate such as a silicon substrate. The dopant atoms enter the crystal lattice of the silicon substrate, collide with silicon atoms and gradually lose energy, finally coming to rest at some depth within the crystal lattice. The average depth is controlled by adjusting the acceleration energy. The dopant dose is controlled by monitoring the ion current during implantation.

One consequence of ion implantation is that defects are introduced into the crystal lattice. In silicon substrates, these defects are silicon atoms which are dislocated from the crystal lattice during the implant. The presence of these silicon interstitials that result from the implant cause certain dopants such as boron and phosphorus to diffuse further into the silicon substrate than they otherwise would if the silicon interstitials were not present. The effect of the silicon interstitials on the diffusion of dopants is referred to as transient enhanced diffusion (TED). The effect is transient because the amount of silicon interstitials, and therefore the effect of the silicon interstitials on dopant diffusion, decreases when the substrate is annealed.

The design rules for semiconductor devices are getting progressively smaller, i.e., 0.5 $\mu$m to 0.35 $\mu$m to 0.25 $\mu$m to 0.18 $\mu$m, etc. As design rules decrease, the necessary dopant profile (the dopant profile is the concentration of dopant as a function of the depth in the substrate) is becoming increasingly difficult to achieve. This is because the desired region (e.g. the source, drain, emitter, etc.) in which the high concentration of dopant is introduced is becoming smaller. For example, the dopant profile in the emitter/base junction of bipolar transistors must be carefully controlled in order for electrons (in the case of an n-p-n transistor) to travel across the thin base region for high frequency performance. However, as design rules decrease, TED effects are becoming more significant in the final dose profile. The TED effect varies depending upon the implant energy and dose, so the conditions that are required for a particular dopant profile are difficult to select when TED effects become significant. Also, as the depth of the region in which the desired dopant profile is introduced decreases, the damage (i.e. crystalline defects) caused by the dopant implant can unacceptably increase the leakage current of the device when off and unacceptably reduce the carrier mobility of the device when on.

TED occurs during post-implant annealing and arises from the fact that the diffusion of dopant atoms, particularly boron (B) and phosphorus (P), is undesirably enhanced by excess silicon (Si) self-interstitials generated by the implant. The generation of excess Si self-interstitials by the implant also leads to a phenomenon herein referred to as dynamic clustering whereby implanted dopant atoms form clusters or agglomerates in a semiconductor layer. These clusters or agglomerates are immobile and electrically inactive. Whereas in the past TED and dynamic clustering were not issues which overly concerned device manufacturers, TED and dynamic clustering now threaten to impose severe limitations on the minimum device dimensions attainable in future silicon device technologies.

Because of the difficulty in controlling the effects of implantation such as TED and crystalline defects, techniques that introduce dopants into silicon substrates without implantation have been sought. For example, Uchino, T., et al., "Very-High-Speed Silicon Bipolar Transistors with In-Situ Doped Polysilicon Emitter and Rapid Vapor-Phase Doping Base," *IEEE Transactions on Electron Devices*, Vol. 42:3 (1995) describes a technique in which rapid vapor phase doping (RVD) is used to introduce the desired boron dopant profile into the base region of a bipolar device and in-situ doping is used to introduce the desired phosphorous dopant profile in the emitter region of a bipolar device. Such techniques in which dopants are out-diffused into the substrate typically require either a high temperature (e.g. temperatures of 850° C. or higher) anneal or a long anneal cycle time (e.g. cycle times greater than one hour). One disadvantage of high temperature long cycle time anneals is that there is no way to isolate a region of the device from the effects of the anneal. Consequently, potential anneal conditions are limited by the region of the substrate with the lowest thermal budget. Therefore, an anneal process in which the effects are localized is desired in those instances where time and temperature alone cannot be manipulated to provide the desired dopant profile without adversely affecting another region of the substrate.

SUMMARY OF THE INVENTION

The present invention is directed to a process for semiconductor device fabrication and specifically, a process for fabricating devices with shallow junctions. For the purpose of the present invention, shallow junctions are junctions with a depth of about 0.2 $\mu$m or less. In the process of the present invention, silicon interstitials are introduced into a region of the substrate. It is advantageous if the concentration of silicon interstitials is about $6 \times 10^{16}/cm^3$ to about $3 \times 10^{21}/cm^3$. That region is doped with the desired impurity either before or after the introduction of the silicon interstitials into the substrate.

In the process of the present invention, ion implantation of a non-dopant is used to introduce interstitial silicon atoms of the desired concentration into the semiconductor substrate. In the embodiment of the present invention wherein the substrate is a silicon or silicon-germanium substrate, it is advantageous if silicon atoms are used to generate the interstitial silicon atoms in the substrate. However, other non-dopants such as argon, neon, and germanium are contemplated as suitable. The interstitials are introduced into the region in the desired quantity, either before or after the region is doped with either phosphorous or boron. After both the interstitials and the dopants are introduced into the substrate, the substrate is subjected to a thermal anneal in order to obtain the desired dopant profile.

The implantation of the non-dopant is used in conjunction with a thermal anneal to tailor the dopant profile in the substrate. Since the implantation affects the dopant profile by transient enhanced diffusion (TED), only those dopants that are affected by TED are used in the process of the present invention. Examples of dopants affected by TED are boron and phosphorus.

Techniques for introducing dopants into the substrate are well known to one-skilled in the art. Conventional conditions are contemplated as suitable, provided that the conditions do not introduce a point defect concentration in the substrate that exceeds about $5 \times 10^{16}$ defects/cm$^3$. Because of the limitation on the number of point defects, it is advantageous to dope the substrate by forming a doped layer of polycrystalline material on the substrate and subjecting the substrate to conditions that drive the dopant from the polycrystalline material into the substrate. The conditions used to drive the dopant into the substrate are not critical, provided that an adequate amount of dopant is introduced into the substrate and there is a concentration gradient of dopant in the substrate. However if the dopant profile in the substrate is uniform, then the profile will not be adequately affected by TED. Other conventional expedients for driving the dopant into the substrate, e.g., placing the silicon substrate in an atmosphere that contains the dopant gas and implantation, are also contemplated as suitable. If implantation is used to introduce the dopant into the substrate, however, the substrate must be subsequently annealed to reduce the damage from the implant to less than the specified concentration.

The non-dopant is then implanted into the substrate using a dose and energy that are selected to provide a concentration of point defects in the substrate of about $6 \times 10^{16}$ atoms/cm$^3$ to about $3 \times 10^{21}$ atoms/cm$^3$. For implant energies of about 0.1 keV to about 10 MeV, this corresponds, to an implant dose in the range of about $6 \times 10^{11}$ atoms/cm$^2$ to about $3 \times 10^{16}$ atoms/cm$^2$. The substrate is then annealed at a temperature in the range of about 700° C. to about 950° C. to drive the dopants into the region. The presence of the interstitials in the substrate enhances the diffusion of the dopants in the substrate. The implantation conditions and the anneal temperature are selected to provide the desired distribution of dopant (the dopant profile) in the substrate. It is advantageous if the substrate is annealed at a temperature in the range of about 750° C. to about 850° C.

BRIEF DESCRIPTION OF THE DRAWINGS

FIG. 1 illustrates the depth of the arsenic-doped emitter, boron-doped base and phosphorous-doped collector of two different devices.

DETAILED DESCRIPTION

Figure 1A:
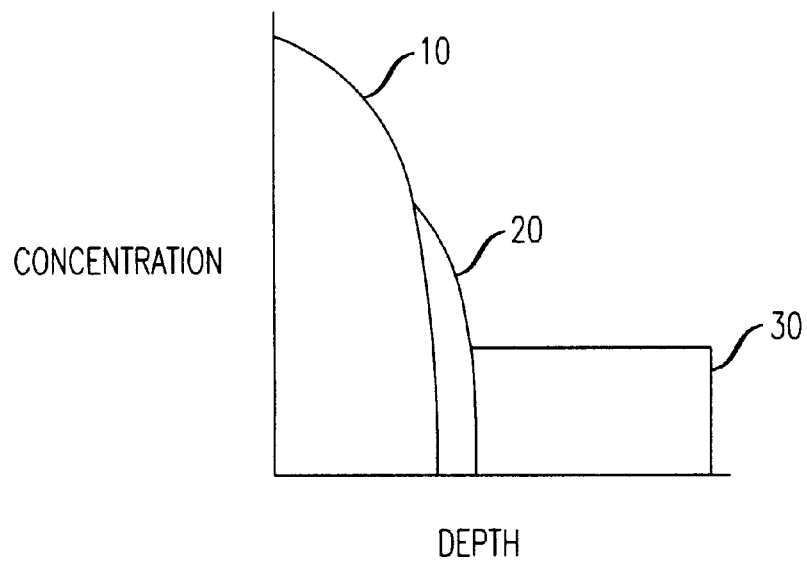
FIG. 1A there was no non-dopant introduced into the substrate prior to the anneal.

The process of the present invention is used to control the distribution of a dopant (i.e. the dopant profile) in a crystalline substrate. As previously noted, as submicron devices decrease in size, the dopant profile in the substrate must be more tightly controlled. Because of the way in which dopants are driven into the substrate, either by implantation or a thermal drive-in force (e.g. a thermal anneal), it is difficult to adequately control the dopant profile, especially in shallow junctions (i.e. junctions with a depth of 0.2 μm or less). For purposes of this disclosure, the junction depth is defined as the depth in the substrate at which the concentration of dopant is $1 \times 10^{17}$ atoms/cm$^3$ or higher.

In the process of the present invention, the implant of a non-dopant atom is used to control the subsequent distribution of dopant into a crystalline substrate. The energy and dose of the implant is selected so that the desired distribution of the dopant in the substrate is obtained.

It is advantageous (but not required) if the dopant is introduced into the substrate first. Conventional conditions for introducing dopant into a crystalline substrate are contemplated as suitable provided that the conditions do not introduce a point defect concentration in the substrate that exceeds about $5 \times 10^{16}$ defects/cm$^3$. It is advantageous if the dopant is introduced into the substrate from a dopant source overlying the substrate. The methods include deposited layers of either polysilicon or crystalline silicon or silicon germanium which are heavily doped (e.g. dopant concentration in excess of $1 \times 10^{20}$ atoms/cm$^3$) during the deposition and the introduction of dopant from a dopant gas. In order for TED to effect the desired distribution of dopant, the resulting dopant concentration in the substrate must be somewhat non-uniform.

The non-dopant is then implanted into the substrate using a dose and energy that are selected to provide a concentration of point defects in the substrate of about $6 \times 10^{16}$ atoms/cm$^3$ to about $3 \times 10^{21}$ atoms/cm$^3$. For implant energies of about 0.1 keV to about 1 MeV, this corresponds to an implant dose in the range of about $6 \times 10^{11}$ atoms/cm$^2$ to about $3 \times 10^{16}$ atoms/cm$^2$.

The substrate is then annealed. The temperature of the anneal is selected to provide the desired distribution of the dopant into the substrate. In this regard, the distribution of only certain dopants (e.g., boron, phosphorous) is affected by the TED that results from the combined effect of the non-dopant implant followed by the anneal. The temperature of the subsequent anneal can be in the range of about 700° C. to about 950° C. It is most advantageous to anneal at a temperature in the range of about 750° C. to about 850° C. Annealing temperatures in this range provide a desirable dopant distribution and are compatible with processes in which the thermal budget (i.e. the allowable temperature to which the substrate can be exposed during the process without adverse consequences) is restricted.

For example, in one embodiment of the present invention, the process is used to fabricate a BiCMOS device. When fabricating such a device, the base and emitter of the bipolar device are fabricated on a substrate on which a Complementary Metal Oxide Semiconductor (CMOS) device has previously been fabricated. Consequently, when fabricating the base and emitter regions of the bipolar device, the substrate cannot be subjected to temperatures higher than about 750° C. in order to avoid damaging the CMOS device. In one embodiment of the present process, a boron-doped polysilicon layer is deposited over the bipolar device area. Next, the substrate is subjected to a rapid thermal anneal step to break up the interfacial oxide. In an alternate embodiment, a highly doped, very shallow (i.e. less than 0.1 $\mu$m) boron layer is obtained by direct doping from a dopant gas. The boron-implanted region is then implanted with silicon at a dose in the range of about $1\times10^{13}$ atoms/cm$^2$ to about $1\times10^{14}$ atoms/cm$^2$ and an energy in the range of about 130 keV to about 180 keV. The substrate is then annealed at a temperature of about 700° C. to about 850° C. for a time sufficient to provide a base with the desired depth. The depth of the base is the depth in the substrate that has a boron dopant concentration of at least about $1\times10^{17}$/cm$^3$.

Because the diffusion of only some dopants is affected by TED, the process of the present invention is used to control the dopant profiles of two dopants in the substrate independently. For example, the dopant profile of boron is affected by TED and the dopant profile of arsenic is not. In the formation of the emitter and base region of a bipolar device, arsenic is introduced into the substrate to form the ultrashallow emitter and boron is introduced into the substrate to form the deeper base. Both dopants are introduced into the substrate using conventional expedients such as an overlying layer of doped polysilicon and conditions to drive the dopant from the doped polysilicon into the substrate or direct doping of the substrate from a dopant gas.

Figure 1B:
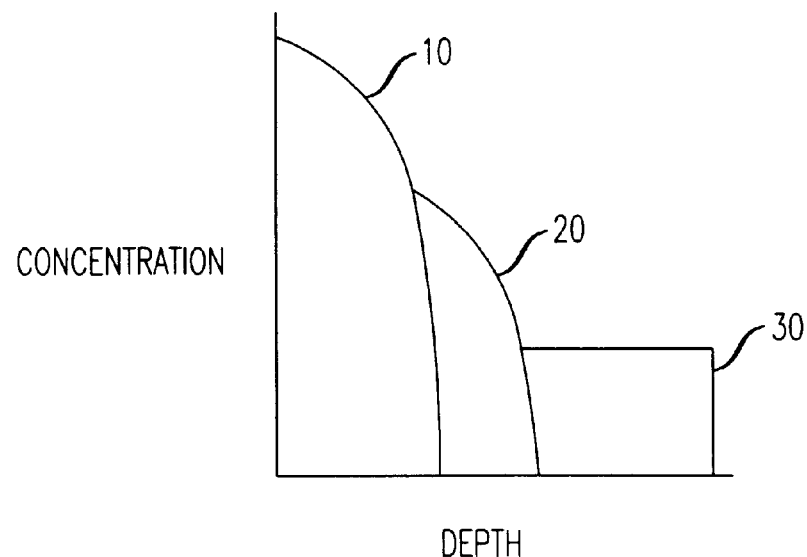
In FIG. 1B, a non-dopant was introduced into the substrate prior to the anneal.

The selective effect of the non-dopant on the diffusion of certain dopants in the substrate is illustrated by FIGS. 1A and 1B. FIGS. 1A and 1B illustrates the depth of an arsenic doped emitter region 10, a boron-doped base region 20, and a phosphorus doped collector region 30 in a substrate. A non-dopant was only introduced into the boron-doped base region 20 in FIG. 1B. The depth of the arsenic-doped emitter regions 10 in FIGS. 1A and 1B are the same. This indicates that non-dopant did not effect the depth of these regions. The depth of the phosphorus-doped region 30 is unaffected because the phosphorus dopant is distributed uniformly, i.e., the concentration gradient of the phosphorus in the substrate is zero. However, the depth of the boron-doped base is significantly greater in FIG. 1B than in FIG. 1A, which indicates that the non-dopant significantly affects the distribution of the boron dopant in the substrate.

After both the boron and arsenic dopants are introduced into the substrate, the non-dopant atom is introduced into the emitter/base region of the device. A low temperature (e.g. 750° C.) anneal is then performed. The temperature of the anneal is low enough to produce a very shallow arsenic junction (because the distribution of the arsenic atoms during the anneal is not affected by the presence of the non-dopant interstitials) and a deeper boron junction.

The process of the present invention is advantageous over prior art processes in that the implant of the non-dopant and the introduction of the dopant into the substrate are controlled independently to provide the desired dopant profile. Therefore, in processes where the thermal budget is restricted, the desired dopant profile is obtained using TED that results from the implant of the non-dopant in combination with an anneal, thereby avoiding the use of anneal conditions that would adversely affect other areas of the substrate.

EXAMPLE 1

A 100 nm polysilicon layer, doped with boron to a nominal concentration of $5\times10^{20}$/cm$^3$, was deposited on a silicon wafer. The wafer was annealed at 1050° C. to fracture the oxide at the interface between the polysilicon and the bulk wafer. The samples were implanted with silicon ions at various dosages summarized in Table 1 below. The energy of the implant was 140 keV. After the implantation the samples were annealed at; either 750° C., 825° C., or 900° C. for thirty minutes as summarized in Table 1 below.

TABLE 1

| SAMPLE | SILICON IMPLANT DOSE atoms/cm$^2$ | ANNEAL CONDITIONS |
|---|---|---|
| A | none | none |
| B | none | 750° C./30 minutes |
| C | $1\times10^{13}$ | 750° C./30 minutes |
| D | $3\times10^{13}$ | 750° C./30 minutes |
| E | $6\times10^{13}$ | 750° C./30 minutes |
| F | $2\times10^{14}$ | 750° C./30 minutes |
| G | none | 825° C./30 minutes |
| I | $1\times10^{13}$ | 825° C./30 minutes |
| K | $6\times10^{13}$ | 825° C./30 minutes |
| H | none | 900° C./30 minutes |
| J | $1\times10^{13}$ | 900° C./30 minutes |
| L | $6\times10^{13}$ | 900° C./30 minutes |

Secondary Ion Mass Spectroscopy (SIMS) analysis was performed on the samples to determine the effect of the silicon implant and the subsequent anneal on the boron diffusion from the polysilicon layer into the silicon substrate.

Figure 2:
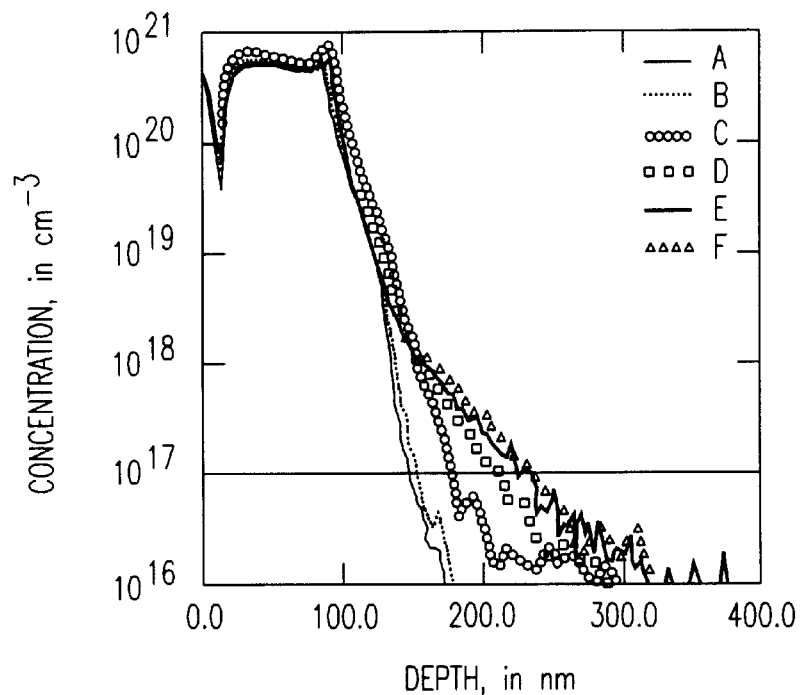
FIG. 2 compares the boron dopant profiles in the substrate that are obtained 1.) without the implant of a non-dopant and without an anneal; 2.) without the implant of a non-dopant and with an anneal at 750° C.; and 3.) with the implant of silicon at various doses and with an anneal at 750° C.

FIG. 2 illustrates the concentration of boron as a function of the depth in the substrate for samples A–F. Referring to FIG. 2, the junction depths (junction depth is defined as the depth at which the boron concentration is at least $1\times10^{17}$ atoms/cm$^3$) for sample A (no silicon implant and no anneal) and sample B (no silicon implant followed by anneal) were about the same. the junction depths for samples C–E illustrate that junction depth increased with increasing silicon implant dose. However, sample D illustrates that junction depth did not further increase when the silicon dose was increased from $6\times10^{13}$ atoms/cm$^2$ to $2\times10^{14}$ atoms/cm$^2$. FIG. 2 illustrates that the junction depth was increased by about 80 nm using the silicon implant.

Figure 3:
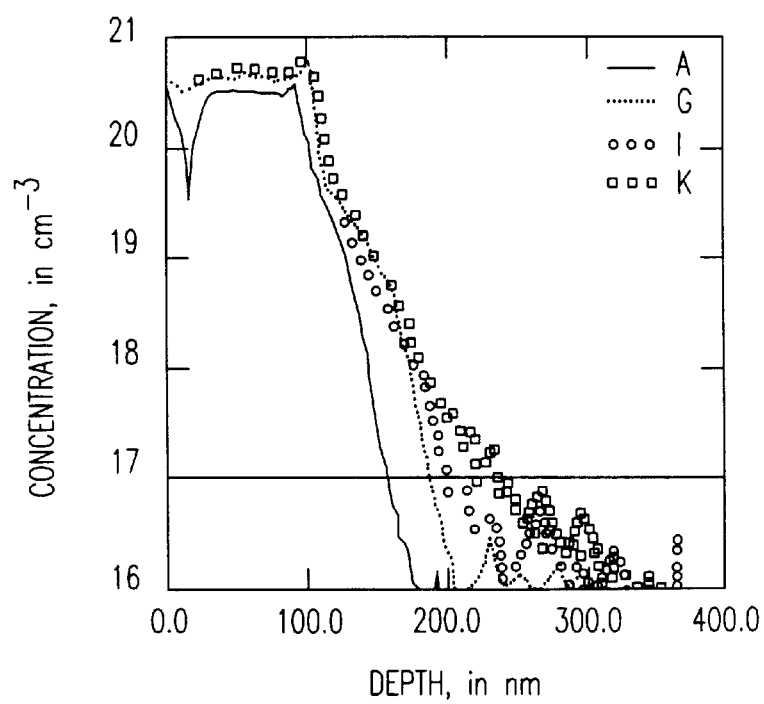
FIG. 3 compares the boron dopant profiles in the substrate that are obtained 1.) without the implant of a non-dopant and without an anneal; 2.) without the implant of a non-dopant and with an anneal at 850° C.; and 3.) with the implant of silicon at various doses and with an anneal at 850° C.

FIG. 3 illustrates the concentration of boron as a function of the depth in the substrate for samples A, G, I, and K. The junction depth of substrate G (no silicon implant followed by anneal at 825° C.) was significantly greater than the junction depth of substrate B because of the higher temperature anneal (825° C. vs. a 750° C. anneal for substrate B). Consequently, the increase in the junction depth of the substrates annealed at 825° C. that is attributable to the silicon implant is somewhat less. FIG. 3 illustrates that a silicon implant further increased the junction depth, even with the 825° C. anneal. However, the amount of increase was less compared to the amount to which the silicon implant increased the junction depth with the 750° C. anneal.

Figure 4:
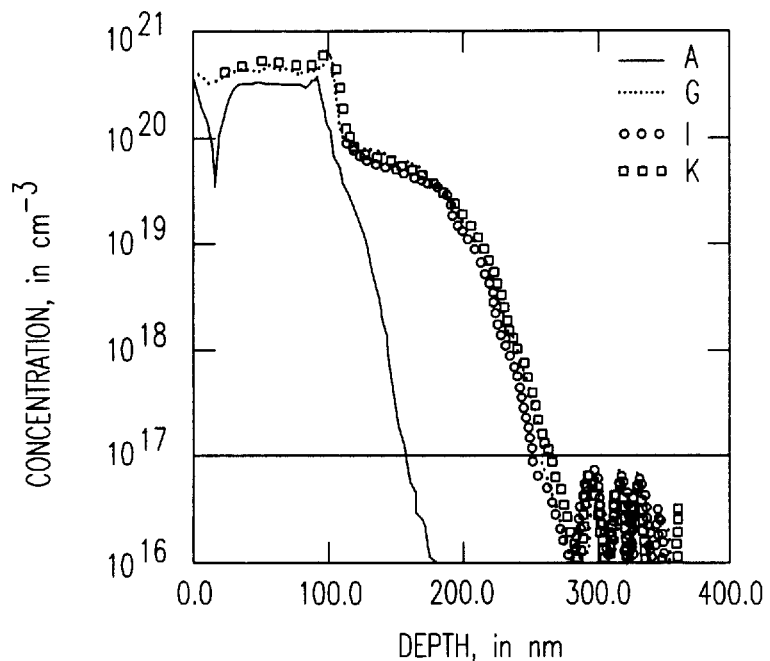
FIG. 4 compares the boron dopant profiles in the substrate that are obtained 1.) without the implant of a non-dopant and without an anneal; 2.) without the implant of a non-dopant and with an anneal at 900° C.; and 3.) with the implant of silicon at various doses and with an anneal at 900° C.

FIG. 4 illustrates the concentration of boron as a function of the depth in the substrate for samples A, H, J, and L. FIG. 4 illustrates that the high temperature anneal had the dominant effect on the depth of the junction and that the silicon implant had a very small effect on the junction depth. In fact, a silicon implant with a dose of $6\times10^{13}$ atoms/cm$^2$ with a subsequent anneal at 900° C. (sample L) increased the depth of the junction by about 10 nm over the junction depth that was obtained without a silicon implant and an anneal at 900° C. (sample H). By contrast, the junction depth of sample E (the result of a silicon implant of the same dose and energy but followed by a 750° C. anneal) was 80 nm greater than the junction depth of sample B (the result of no silicon implant followed by a 750° C. anneal. Clearly at lower anneal temperature, the effect of the silicon implant on the doping profile is greater than at temperatures of about 900° C. or higher.

EXAMPLE 2

The performance of bipolar devices are controlled by controlling the effects of TED on the profile of the dopant in the substrate. This effect was illustrated by modeling the electrical performance of bipolar devices with a base having the boron dopant profiles of samples A, C, D, and F. The model used is described in Pinto, M. R., et al., "Three-dimensional characterization of bipolar transistors in a submicron BiCMOS technology using integrated process and device simulation," *IEDM,* Vol. 92, pp. 923–926 (1992), which is hereby incorporated by reference.

Figure 5:
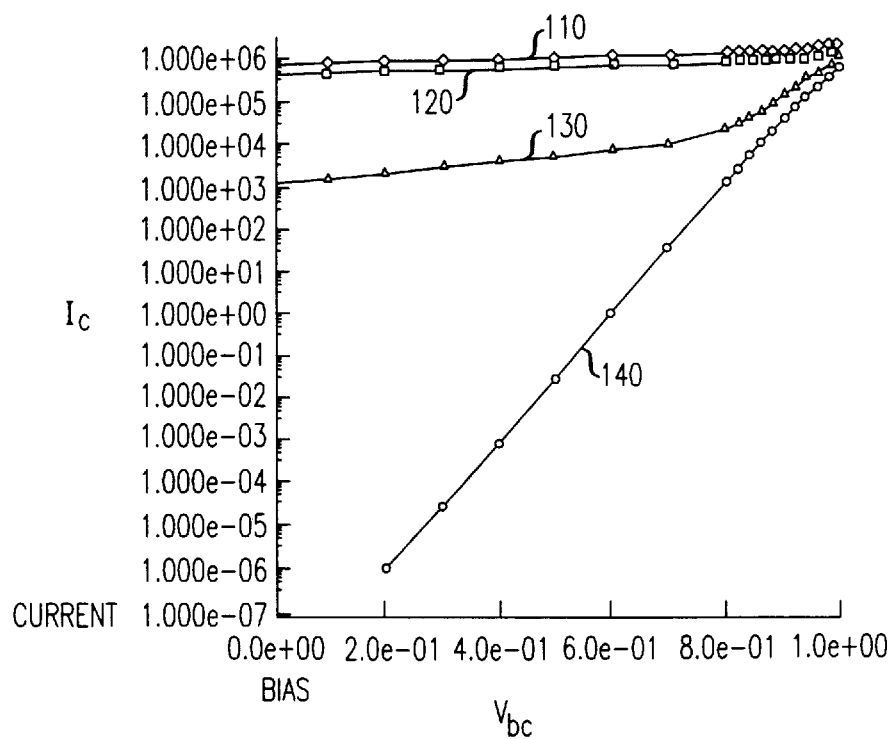
FIG. 5 compares the modeled performance of devices in which the boron dopant profile was obtained 1.) without the implant of a non dopant and without an anneal; and 2.) with the implant of silicon at three different doses and with an anneal at 750° C.

Using the software, the collector current as a function of the base emitter voltage was modeled. As illustrated by FIG. 5, not every profile provided a device that had the necessary relationship between the collector current and the emitter voltage to function as a bipolar device. Specifically, the modeled relationship between the collector current and the base emitter voltage of a device with a boron dopant profile that was obtained without the non-dopant implant and without an anneal (A in Table 1) is illustrated is represented by line 110 in FIG. 5. This device was unacceptable because the collector current remained constant with varying emitter voltage. Consequently, the collector current could not be controlled.

The relationship between the collector current and the base emitter voltage of devices with boron dopant profiles obtained using the conditions for sample C Table 1 was also modeled and is illustrated as line 120 in FIG. 5. This modeled device was also unacceptable, again because the collector current was not controllable. The relationship between the collector current and the base emitter voltage of devices with boron dopant profiles obtained using the conditions for sample D Table 1 was also modeled and is illustrated as line 130 in FIG. 5. Although the collector current did respond somewhat to a change in the emitter voltage, the response was not acceptable because there was virtually no change in the collector current over a wide range of emitter voltages. Consequently, this modeled device did not exhibited acceptable bipolar behavior.

The relationship between the collector current and the base emitter voltage of devices with boron dopant profiles obtained using the conditions for sample F Table 1 was also modeled and is illustrated as line 140 in FIG. 5. This modeled device exhibited acceptable bipolar behavior because the collector current was adequately controlled by the emitter voltage.

The process of the present invention can therefore be used to tailor the dopant profile in the substrate to provide a device with the desired performance characteristics. In the present process, TED is used to localize the effect. That is, the dopant profile is affected only in those regions of the substrate in which the non-dopant is implanted. This is in contrast to high temperature annealing which affects the entire substrate. The process thereby provides a clear advantage in those instances where a certain dopant profile is desired but the thermal budget (i.e. the maximum allowable temperature to which the substrate can be exposed without adverse consequences) limits the use of temperature alone to affect the desired dopant profile. By using the implant of a non-dopant in conjunction with a lower temperature anneal to affect the desired dopant profile, improved process flexibility is achieved.

What is claimed is:

1. A process for device fabrication comprising:
   selecting a desired distribution of a first dopant in a substrate;
   introducing a second dopant, the first dopant and a non-dopant into the substrate wherein the first dopant and the non-dopant are introduced into the same region of the substrate and the concentration of the non-dopant and its placement are selected to cause the first dopant to diffuse into the substrate by transient enhanced diffusion and wherein the dopants, when introduced into the substrate, do not introduce a point defect concentration that exceeds about $5 \times 10^{16}$ defects/cm$^3$ in the region of the substrate in which the first dopant and the non-dopant are introduced;
   annealing the substrate at an elevated temperature for period of time selected to provide the desired distribution of the first dopant into the substrate.

2. The process of claim 1 wherein the substrate is a silicon substrate and the non-dopant is selected from the group consisting of silicon, argon, neon, and germanium.

3. The process of claim 2 wherein the concentration of the non-dopant in the substrate is about $6 \times 10^{16}$ atoms/cm$^3$ to about $3 \times 10^{21}$ atoms/cm$^3$.

4. The process of claim 3 wherein the substrate is annealed at a temperature in the range of about 700° C. to about 950° C.

5. The process of claim 4 wherein the substrate is annealed at a temperature in the range of about 750° C. to about 850° C.

6. The process of claim 1 wherein the semiconductor device is a bipolar device.

7. The process of claim 6 wherein the first dopant is boron and the second dopant is arsenic or phosphorus.

8. The process of claim 6 wherein the first dopant is boron or phosphorus and the second dopant is arsenic.

9. The process of claim 6 wherein the substrate has an arsenic doped emitter region, a boron-doped base region and a phosphorus-doped collector region.

10. The process of claim 9 wherein the arsenic is introduced in the emitter region and the boron is introduced into the base region before the non-dopant is introduced into the substrate.

* * * * *